US006424171B1

(12) United States Patent
Motomura et al.

(10) Patent No.: US 6,424,171 B1
(45) Date of Patent: Jul. 23, 2002

(54) BASE CELL AND TWO-DIMENSIONAL ARRAY OF BASE CELLS FOR PROGRAMMABLE LOGIC LSI

(75) Inventors: Masato Motomura; Taro Fujii; Koichiro Furuta, all of Tokyo (JP)

(73) Assignee: NEC Corporation, Tokyo (JP)

( * ) Notice: Subject to any disclaimer, the term of this patent is extended or adjusted under 35 U.S.C. 154(b) by 12 days.

(21) Appl. No.: 09/429,362

(22) Filed: Oct. 28, 1999

(30) Foreign Application Priority Data

Oct. 30, 1998 (JP) .......................................... 10-309285

(51) Int. Cl.$^7$ .......................................... H03K 19/177
(52) U.S. Cl. .......................................... 326/41; 326/38
(58) Field of Search ...................................... 326/37–41

(56) References Cited

U.S. PATENT DOCUMENTS

| | | | |
|---|---|---|---|
| 4,918,440 A | | 4/1990 | Furtek |
| 5,208,491 A | | 5/1993 | Ebeling et al. |
| 5,656,950 A | * | 8/1997 | Duong et al. ................. 326/41 |
| 5,787,007 A | * | 7/1998 | Bauer .......................... 326/41 |
| 5,880,598 A | * | 3/1999 | Duong ........................ 326/41 |
| 5,905,385 A | * | 5/1999 | Sharpe-Geisler ............. 326/41 |
| 5,942,913 A | * | 8/1999 | Young et al. ................. 326/41 |
| 6,031,391 A | * | 2/2000 | Couts-martin et al. ........ 326/41 |

FOREIGN PATENT DOCUMENTS

| | | |
|---|---|---|
| EP | 0507507 A2 | 10/1992 |
| GB | 2280293 A | 1/1995 |
| JP | 57-129536 | 8/1982 |
| JP | 8-509344 | 10/1996 |
| JP | 10-93422 | 4/1998 |
| WO | WO 95/22205 | 8/1995 |

* cited by examiner

*Primary Examiner*—Don Phu Le
(74) *Attorney, Agent, or Firm*—Rosenman & Colin LLP

(57) ABSTRACT

A programmable logic LSI resolves a problem leaving some wiring resource extra upon realizing one circuit (some wiring cells are not used) and leaving some logical resource extra upon realizing another circuit (some logical cell are not used, and can realize both functions of logical resource and wiring resource with a single base cell. The base call for a programmable logic LSI which is formed by connecting a plurality of the base cells, includes a combined programmable circuit realizing a programmable logic circuit function and a programmable wiring circuit function, and a mode setting circuit for selectively making one of the programmable logic circuit function and the programmable wiring circuit function according to a mode information. Upon functioning as the programmable logic circuit, logical operation is performed with respect to an input signal input to the base cell to feed an output signal. On the other hand, upon functioning as programmable wiring circuit, a plurality of bi-directional connection lines connected to the base cell are connected with each other.

13 Claims, 13 Drawing Sheets

BASE CELL AND TWO-DIMENSIONAL ARRAY OF BASE CELLS FOR PROGRAMMABLE LOGIC LSI

BACKGROUND OF THE INVENTION

1. Field of the Invention

The present invention relates generally to a programmable logic LSI and a two-dimensional array. More particularly, the invention relates to a two-dimensional array, in which base cells are connected with each other, forming a programmable logic LSI, such as field programmable gate array (FPGA) and so forth.

2. Description of the Related Art

A programmable logic LSI, typically an FPGA, is an LSI which internally holds a configuration information designating how a hardware is configured, and realizes a desired hardware according to designation of the configuration information. In the recent years, associating with expansion of scale of hardware which can be realized by the programmable logic LSI owing to progress of semiconductor fabrication technologies, replacement from gate array LSIs to the programmable logic LSIs is in progress and is attracting attention.

Elements forming the programmable logic LSI are three elements constituted of logic cells, wiring cells and external input and output cells. The logic cell has a function for realizing arbitrary logical operation, such as four input and one output, according to designation of the configuration information. The wiring cell has a function connecting an output of a certain logic cell and an input of another logic cell, for example, according to designation of the configuration information. On the other hand, the external input and output cell executes inputting and outputting signals from and to outside of the programmable logic LSI. Feature of the programmable logic LSI is determined by how the three elements are arranged and how mutually connection is established. It should be noted that the present invention concerns construction of the logic cell and the wiring cell among the foregoing three elements and array structure thereof. Therefore, discussion for the external input and output cell will be neglected from the following disclosure in order to avoid complication of disclosure by including discussion of unnecessary element and to keep the disclosure simple enough to facilitate clear understanding of the present invention.

Here, construction of the conventional programmable logic LSI can be generally classified into two types. One type is that disclosed in U.S. Pat. No. 4,870,302, for "Configurable Electrical Circuit having Configurable Logic Elements and Configurable Interconnects" owned by Xilinx, Inc. and Re-Issue Pat. No. 34,363 as reissue patent of the former, which will be referred to hereinafter as first prior art. The other type is that disclosed in U.S. Pat. No. 5,155,389, for "Programmable Logic Cell and Array", owned by Concurrent Logic, Inc, which will be referred to hereinafter as second prior art.

In the first prior art, as can be clear from the title of the invention, there has been disclosed a method for realizing a programmable logic LSI by combination of re-configurable, namely programmable logic cell and re-configurable, namely programmable wiring cell. Namely, the programmable logic LSI is formed by arranging sets of the logic cells and the wiring cells in a two-dimensional array.

Next, in the second prior art, there has been disclosed a method for realizing the programmable LSI with uniform two-dimensional array of the programmable logic cells. In this second prior art, respective logic cells are directly connected to adjacent four logic cells with single direction wiring. The feature of the second prior art is that the logic cells thus connected serve as the wiring cells. Accordingly, in the second prior art, there is no wiring cell, basically.

The first prior art is advantageous in that the logic cell and the wiring cell can be optimized adapting to the tasks thereof. However, the first prior art holds shortcoming in that a ratio of logical resource and wiring resource is physically fixed in the programmable logic LSI. In general, there are wide variety of circuits to be realized by users on the programmable logic LSI, wherein some require large logical resource but a little wiring resource, such as data path or so forth, another some require large wiring resource but a little logical resource, such as bus or so forth. Therefore, if the ratio of physical logical resource and the wiring resource is fixed, certain amount of wiring resource becomes extra, namely not used, in realization of some circuit, and, in another case, certain amount of the logical resource becomes extra, namely not used, in realization of another circuit. This program is significant and critical in the first prior art.

The second prior art, different from the first prior art, the shortcoming as held by the first prior art will never be encountered since the logic cells realize the function of the wiring cells. However, the wiring utilizing the logical cell as that in the second embodiment encounters a program in flexibility of the wiring. The reason is that this technology realizes the function as the wiring cell by extending the basic function of the logic cell.

More particularly, in the second prior art, the logical cell is constructed as four input and four output. Then, the function as the wiring cell is realized by simply designating connecting between the input for the logic cell and the output thereof without internally performing logical operation. Accordingly, the second prior art may establish only connection between connection lines of single direction which is fixed propagating direction of the signal. Therefore, the second prior art cannot establish connection between bi-directional connection lines which are required for forming bi-directional bus or so forth.

In addition, Japanese Unexamined Patent Publication No. Heisei 10-93422 discloses similar circuit which can establish only connection between connection lines of single direction for fixed signal propagating direction and cannot establish connection between bi-directional connection lines necessary for forming the bi-directional bus or so forth.

SUMMARY OF THE INVENTION

The present invention has been worked out in view of the drawbacks in the prior arts as set forth above. Therefore, it is the first object of the present invention to provide as base cell for a programmable logic LSI and a two-dimensional array of the base cells, which can resolve the shortcoming of the foregoing first prior art in that a ratio of wiring resource and logical resource is fixed and can be variable of the ratio of the wiring resource and the logical resource adapting to a circuit construction to be realized.

The second object of the present invention is to provide a base cell for a programmable logic LSI and a two-dimensional array of the base cells, which can accomplish the foregoing first object to realize a circuit which is efficient and has various mutually distinct features.

According to the first aspect of the present invention, a base call for a programmable logic LSI which is formed by connecting a plurality of the base cells, comprises:

a combined programmable circuit realizing a programmable logic circuit function and a programmable wiring circuit function; and a mode setting circuit for selectively making one of the programmable logic circuit function and the programmable wiring circuit function according to a mode information.

In the construction set forth above, the mode setting circuit may have a mode information memory storing the mode information, and one of the programmable logic circuit function and the programmable wiring circuit function may be selectively made effective according to the mode information stored in the mode information memory. Each of a plurality of the base cells connected for forming the programmable logic LSI may be connected to adjacent other base cell with a plurality of bi-directional connection lines.

It is preferred that the combined programmable circuit includes a storage element group outputting data corresponding to input data and a switch group provided corresponding to each storage element of the storage element group, when the programmable wiring circuit function is effective, one of the plurality of bi-directional connection lines is electrically connected with other bi-directional connection line by ON/OFF controlling each switch element of corresponding switch element group depending upon each storage data of the storage element group. In the alternative, the combined programmable circuit includes a storage element group outputting data corresponding to input data and a switch group provided corresponding to each storage element of the storage element group, when the programmable logic circuit function is effective, a storage data of the storage element in the storage element group designated by a signal input from one of the plurality of bi-directional connection line is output to other bi-directional connection line. The storage data of each storage element of the storage element group may be externally input.

Preferably, a bit map information designating interconnection between internal bi-directional wiring may be stored in the storage element. Also, a look-up table information for realizing predetermined logical operation may be stored in the storage element.

According to the second aspect of the present invention two-dimensional array of base cell formed by arranging a plurality of base cells set forth above in two-dimensional array and connecting respectively adjacent base cells with a plurality of bi-directional connection lines.

In the construction set forth above, each of the base cell in the two-dimensional array may be connected with four base cells adjacent in upward, downward, leftward and rightward direction. In the alternative, each of the base cell in the two-dimensional array may be connected with adjacent eight base cells arranged therearound.

In further preferred construction, all of the mode information memory within each of the base cell in the two-dimensional array may be serially connected in daisy chain, and the mode information is externally input in sequential order.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

Figure 1:
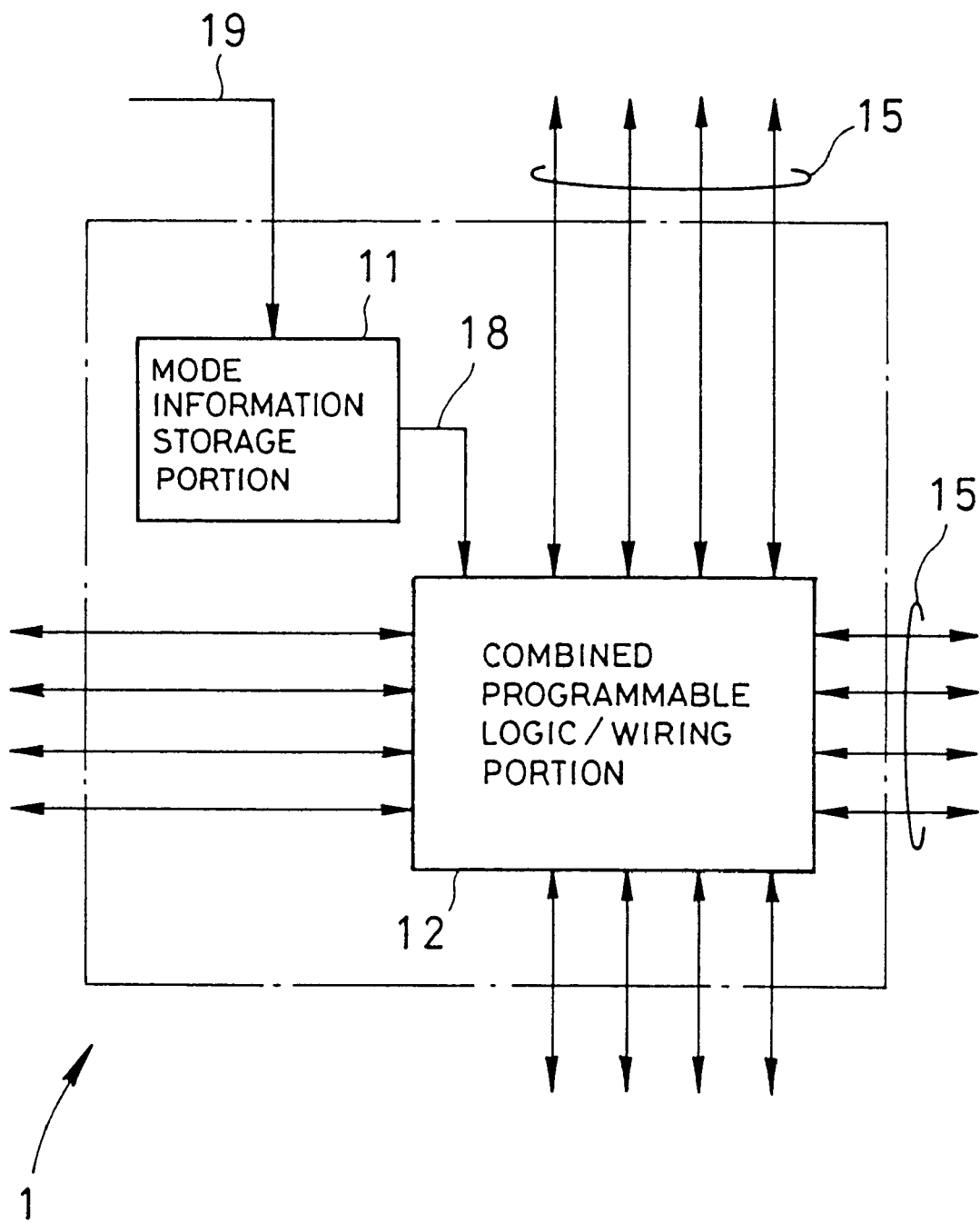
FIG. 1 is a block diagram showing one embodiment of a structure of a base cell for a programmable logic LSI in accordance with the present invention.

The present invention will be discussed hereinafter in detail in terms of the preferred embodiment of the present Invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention. Also, through out the drawings and disclosure, like elements will be identified with like reference numerals.

FIG. 1 is a block diagram showing one embodiment of a base cell of a programmable logic LSI in accordance with the present invention. In FIG. 1, the base cell 1 includes a mode information storage portion 11, a combined programmable logic/wiring portion 12, a plurality of bi-directional connection lines 15, a mode designation line 18 and a mode information input line 19. In the embodiment shown in FIG. 1, the respective four bi-directional connection lines 15 are extended in upward, downward, leftward and rightward directions. However, number of the bi-directional connection lines should not be specified and can be any reasonable number.

The mode information storage portion 11 stores a mode information input from the mode input line 19. The mode information is information designating function of the combined programmable logic/wiring circuit 12, such as to function as a programmable logic circuit, to function as a programmable wiring circuit or so forth. Designation of the mode is performed through the mode designation line 18.

As set forth above, in the present invention, since the combined programmable circuit which realizes both of the programmable logic circuit and the programmable wiring circuit in single base cell and selectively makes one of these functions effective according to the mode information, a ratio of a wiring resource and a logical resource can be varied freely depending upon a construction of the circuit to be realized by forming a two-dimensional array with such base cells.

Figure 2:
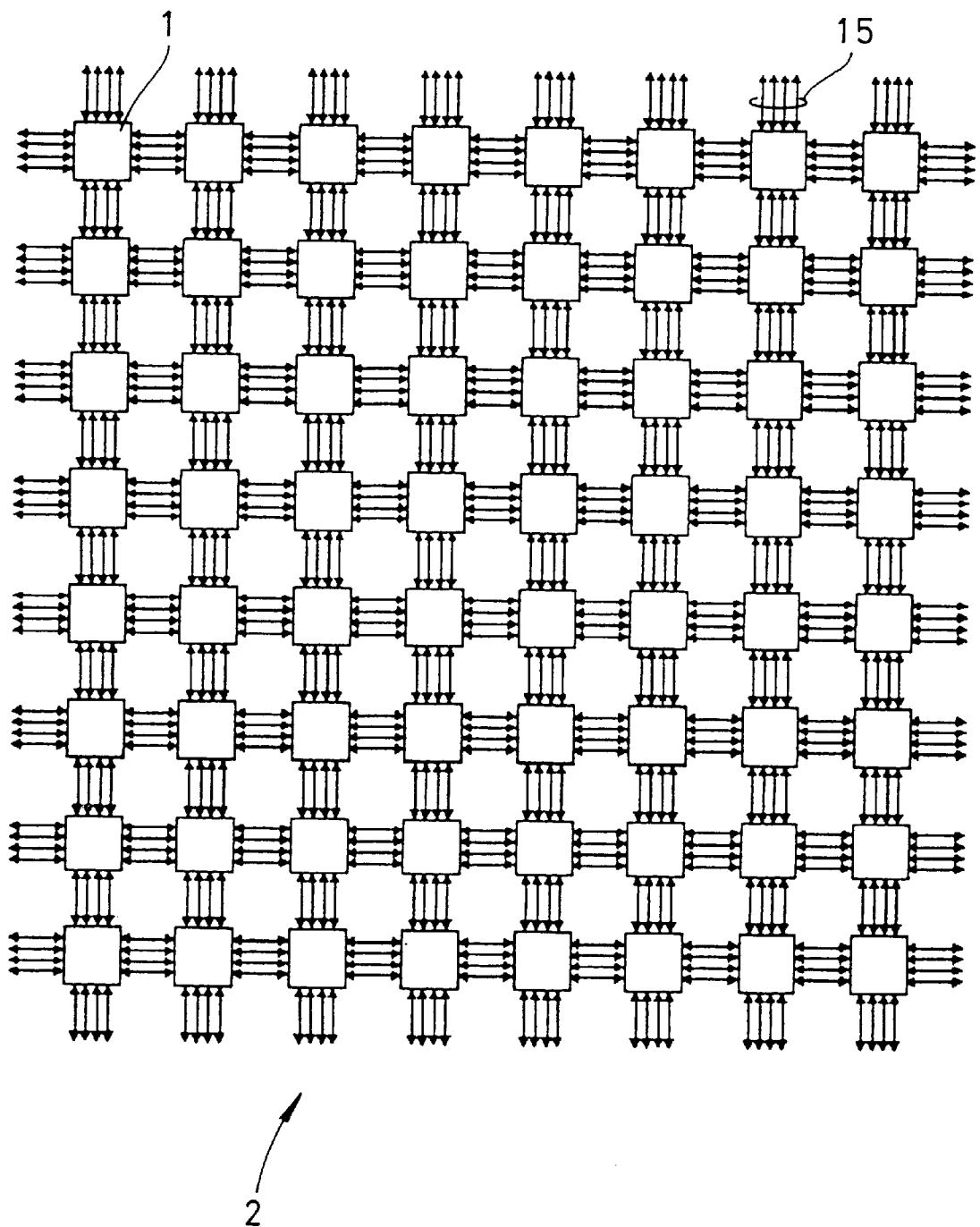
FIG. 2 is a block diagram showing one embodiment of a structure of a two-dimensional array of the base cells of one embodiment of the programmable logic LSI in accordance with the present invention.

FIG. 2 is a block diagram showing one embodiment of a two-dimensional array 2 of the base cell in the programmable logic LSI according to the present invention. In FIG. 2, the two-dimensional array 2 of the base cells is formed by arranging the base cells 1 in two-dimensional array and directly connecting the base cells 1 adjacent in upward, downward, leftward and rightward directions with bi-directional connection lines 15. In order to realize programmable logic LSI, it becomes necessary to arrange input/output cells around the two-dimensional array 2 of the base cells and connect those input/output cells with the two-dimensional array 2 of the base cells.

Here, since the foregoing mode information is used for designation of the mode, required number of bit may be one bit per each base cell at minimum. In the shown embodiment, in addition to the mode information, information necessary for controlling respective selectors are stored in the mode information storage portion 11 in each base cell 1. The mode information and so forth may be input upon fabrication of the LSI or before shipping. In the alternative, it is also possible to permit the user to input the mode information or so forth after shipping.

An input method of the mode information or so forth is as follows. Namely, all of the mode information storage portions in respective base cells shown in FIG. 2 may be serial connected by daisy chain connection and the mode information or so forth may be externally input sequentially. On the other hand, it is also possible to simultaneously input the mode information or so forth for the base cells in the same row and thus to separately input the mode information or so forth per row.

Figure 3:
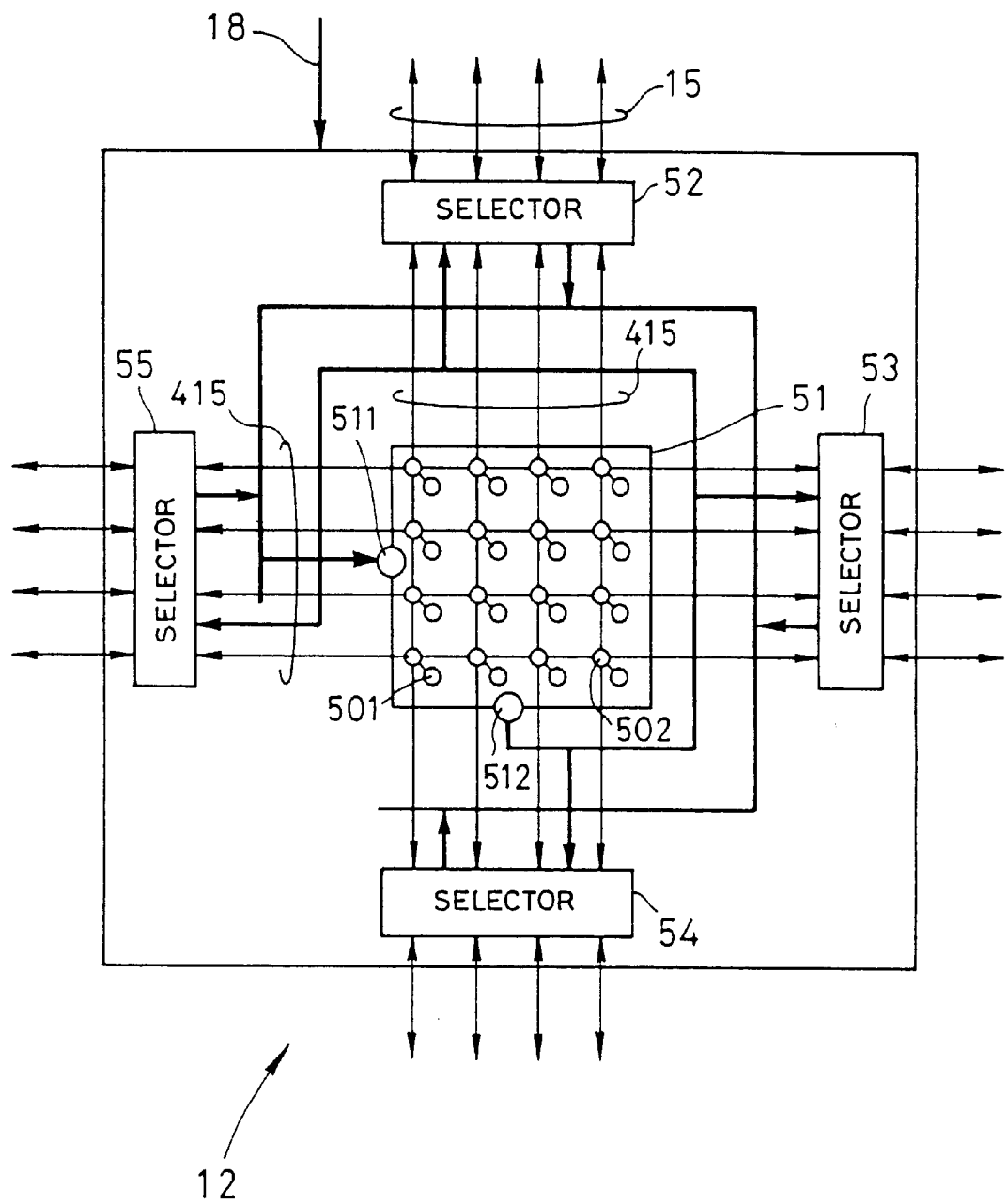
FIG. 3 is a block diagram showing a construction of a combined programmable logic/wiring portion in the base cell of the one embodiment of the programmable logic LSI in accordance with the present invention.

FIG. 3 is a block diagram showing a construction of the combined programmable logic/wiring portion 12 for realizing the programmable logic circuit function and programmable wiring circuit function. Namely, FIG. 3 shows a construction necessary to selectively perform both of the programmable logic circuit function and the programmable wiring circuit function depending upon designation by the mode information input through the mode designation line 18.

In FIG. 3, the combined programmable logic/wiring portion 12 is constructed with including a memory portion 51 and a plurality of selectors 52 to 55.

The memory portion 51 has a construction, in which a plurality of sets each constituted of a storage element 501 and a switch element 502 are arranged in two-dimensional array fashion. The storage element 501 is adapted to store one bit information. The switch element 502 is a switch element constructed with a MOS transistor or the like provided corresponding to each storage element 501. The switch element 502 determines whether the internal bi-directional wiring 415 in vertical direction and lateral direction are to be connected or not depending upon one bit storage information of the corresponding storage element 501.

In such construction, upon serving as the programmable logic circuit according to designation by the mode information input through the mode designation line 18, the memory portion 51 stores look-up table information in a storage element group consisted of the respective of the internal storage elements 501. The memory portion 51 outputs a part of the look-up table information through a data output terminal 512 depending upon an address input through an address input terminal 511.

Here, for example, in order to realize arbitrary logical operation of four input one output with reference to the look-up table information, sixteen bits for look-up table information, four bits for address input and one bit for data output become necessary. Namely, in this case, a memory capacity of the memory portion 51 becomes sixteen bits (sixteen storage elements 501) and data output becomes one bit.

In this case, the selectors 52 to 55 selects the signal to be input to the address input terminal 511 among the signals input from a plurality of the bi-directional connection lines 15 to which signals are input from a plurality of base cells 1 adjacent the combined programmable logic/wiring portion 12 of certain base cell 1 and selects the bi-directional connection line 15 to which signal is output from the data output terminal, among a plurality of bi-directional connection lines 15.

For example, when respective four bi-directional connection lines 15 are connected from four adjacent base cells located at upper and lower sides and left and right sides, when the address input terminal 511 of the memory portion 51 is four bits and the data output terminal 512 is one bit, the selectors 52 to 55 applies input to the address input terminal from four bi-directional connection lines amount sixteen bi-directional connection lines 15 in total, and output is applied to one bi-directional connection line among sixteen bi-directional connection lines 15 from the data output terminal 512. A control signal of the selectors 52 to 55 determining which bi-directional connection lines 15 are to be used for inputting and outputting is applied from the mode designation line 18 as a part of the mode information. The construction of the selector 52 to 55 may be considered to evenly perform inputting and outputting from arbitrary bi-directional connection lines 15. It is also possible to construct to permit inputting and outputting from only a part of the bi-directional connection lines in order to reduce hardware amount and mode information amount.

Upon serving as the programmable wiring circuit according to the mode information, the memory portion 51 stores the bit map information designating interconnection between the internal bi-directional wiring 415. For example, when respective four internal bi-directional wiring are extended in vertical and lateral directions, the bit map information of sixteen bits becomes necessary in order to designate wiring with arbitrary combination. Therefore, in this case, a construction, in which respective sixteen storage elements 501 and the switching elements 502 are arranged, becomes necessary. The content of the bit map information can be determined freely depending upon application. It may be possible to provide restriction for combination of the vertical and lateral internal bi-directional wiring 415 which can be connected, in order to reduce hardware amount or bit map information amount.

In this case, the selectors 52 to 55 determine whether the bi-directional connection lines 15 connected to the relevant base cell 1 in respectively corresponding internal bi-directional wiring lines 415 or not. The control signal of the selectors 52 to 55 determining which bi-directional connection lines 15 is connected to the corresponding bi-directional wiring line 415 is applied to the mode designation line 18 as a part of the mode information. When the construction of the selectors 52 to 55 is constructed for enabling individual designation for connection between the arbitrary bi-directional connection line 15 and the corresponding internal bi-directional wiring line 415. It may be possible to set groups of plurality of the bi-directional connection lines so as to permit designation only per the group.

Figure 4:
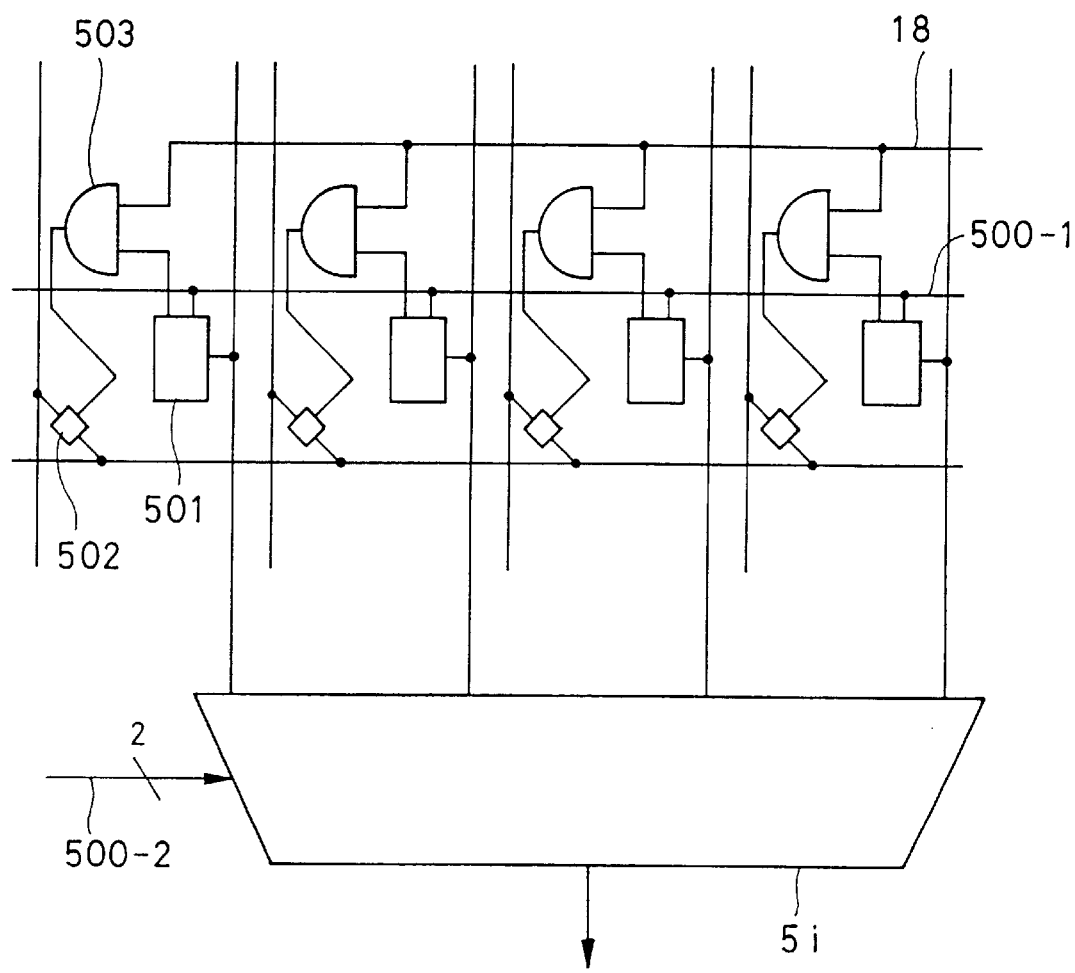
FIG. 4 is an illustration showing an example of internal structure of a memory portion shown in FIG. 3.

Here, an example of the internal structure of the memory portion 51 in FIG. 3 is illustrated in FIG. 4. In FIG. 4, sets of the storage elements 501 and the switch elements 502 arranged in two-dimensional array fashion are shown for one row. Namely, in the memory portion 51 in FIG. 3, the structure shown in FIG. 4 are provided for four rows.

The storage elements 501 shown in FIG. 3 stores one bit information. The switch element 502 determines whether the wiring in vertical and lateral direction are to be connected to not depending upon the storage information of the corresponding storage element 501. In this case, an AND gate 503 is provided corresponding to each set of the storage element 501 and the switch element 502. One of the input of the AND gate 503 is connected to the mode designation line 18. The mode designation line 18 transmits information designating to operate the combined programmable logic/wiring portion 12 as either the programmable logic circuit or the programmable wiring circuit, as set forth above. Accordingly, the storage data of the storage element depending upon the logical level of the mode signal of the mode designation line 18 is applied to the switch element 502 as the control signal.

In this case, if both of the logical level of the mode signal and the storage data of the storage element 501 are "1", the combined programmable logic/wiring portion 12 serves as the programmable wiring circuit, and the switch element 502 turns into ON state. Therefore, the wiring in the vertical direction and the lateral direction are connected electrically. On the other hand, when the logical level of mode signal is "1" and the storage data of the storage element 501 is "0", the combined programmable logic/wiring portion 12 serves as the programmable wiring circuit. However, since the switch element 502 is held at the OFF state, the wiring between the vertical and lateral directions are not connected with each other.

On the other hand, when the logical level of the mode signal is "0", the combined programmable logic/wiring portion 12 serves as the programmable logic circuit so that the storage data of the storage element 501 for one row selected by the control signal 500-1 is input to the selector 5i (I=2 to 5). Then, the selector 5a outputs one row of the storage data of the storage element 501 by selecting according to a control signal 500-2. Namely, the combined programmable logic/wiring portion 12 serving as the programmable logic circuit outputs the storage data of the storage element 501 as data with taking the control signals 500-1 and 500-2 as an address.

Figure 5:
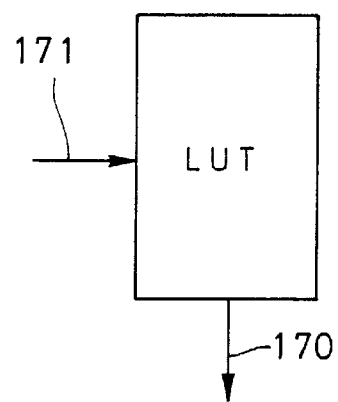
FIG. 5 is an illustration showing a function of the a look-up table.

Accordingly, the memory portion 51 forms the look-up table, as shown in FIG. 5. Namely, by inputting the address as an input signal 171, data is output as an output signal. The address corresponds to the logical input and the data corresponds to the logical output. It should be appreciated that the storage data of each storage element 501 is externally input and written, preliminarily.

Figure 6:
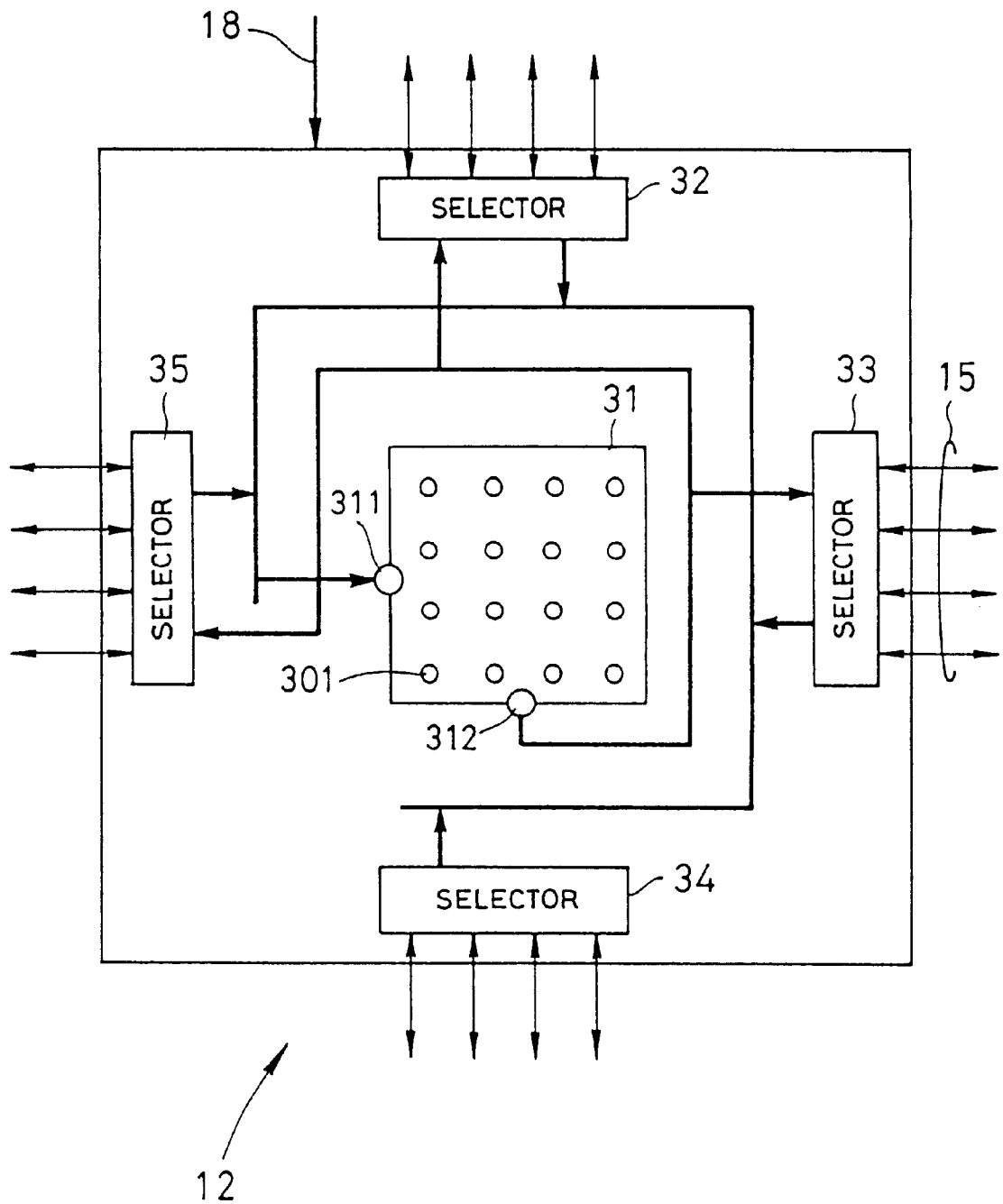
FIG. 6 is an illustration showing a constructional portion which becomes effective in functioning as a programmable logic circuit in the combined programmable logic/wiring portion in FIG. 3.

FIG. 6 shows components of the combined programmable logic/wiring portion 12, which becomes effective as serving as the programmable logic circuit by designation of the mode information via the mode designation line. In FIG. 6, the combined programmable logic/wiring portion 12 is constructed with a memory portion 31 and selectors 32 to 35.

The memory portion 31 has an internal two-dimensional array of storage elements 301. These storage elements 301 store look-up table information to output a part of the look-up table information from a data output terminal 312 depending upon an address input applied from an address input terminal 311. For example, in order to realize arbitrary logical operation of four input one output with the look-up table information, sixteen bits as the look-up table information, four bits as the address input and one bit as data output become necessary. Namely, in this case, a memory capacity of the memory portion 31 is sixteen bits (sixteen storage elements 301), and the data output becomes one bit.

The selector 32 to 35 select which signal among signals input through the bi-directional connection lines 15 is to be input to the address input terminal, and to which bi-directional connection line 15 the signal is to be output from the data output terminal 312. For example, respective four bi-directional connection lines 15 are connected to the base cell from the four base cells adjacent to the former in upper side and lower side, left side and right side. When the address input terminal 311 of the memory portion 31 is four bits and the data output terminal is one bit, the selectors 32 to 35 applies input to the address input terminal 311 from four bi-directional connection lines 15 among sixteen bi-directional connection lines 15, and the output is applied to one of the bi-directional connection lines 15 among total sixteen bi-directional connection lines 15 from the data output terminal 312.

A control signal for the selectors 32 to 35 for determining which bi-directional connection lines 15 are to be used for inputting and outputting, is applied to the mode designation line 18 as a part of the mode information. The structure of the selectors 32 to 35 may be considered to equally perform inputting and outputting from arbitrary bi-directional connection lines 15. However, it is possible to take a structure to permit inputting and outputting for only a part of bi-directional connection lines 15 in order to reduce hardware amount or mode information amount.

Figure 7:
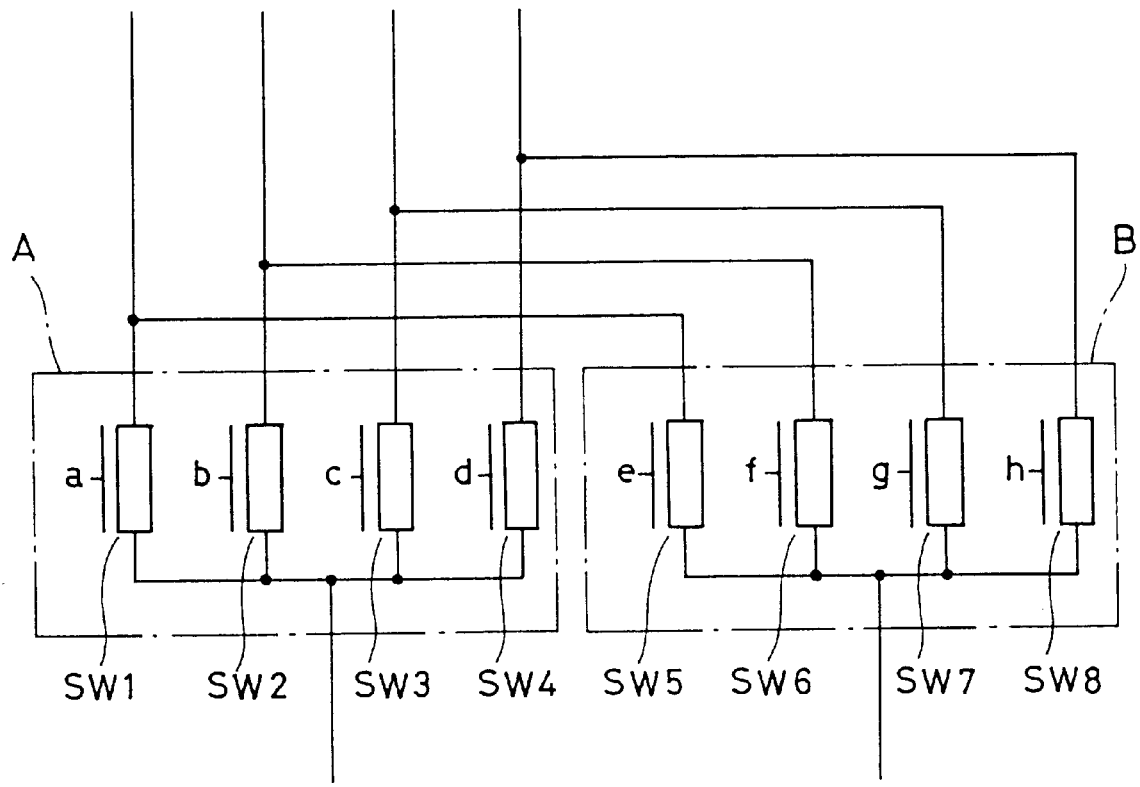
FIG. 7 is an illustration showing an example of internal construction of each selector in FIG. 6.

Each selector in FIG. 6 may be constructed as illustrated in FIG. 7, for example. Namely, bi-directional switches SW1 to SW8 constituted of transfer gates formed with CMOS transistor or the like, are provided corresponding to each of the bi-directional connection lines 15. Then, the bi-directional switches SW1 to SW4 are selectively turned ON and the switches SW5 to SW8 are selectively turned ON.

Figure 8:
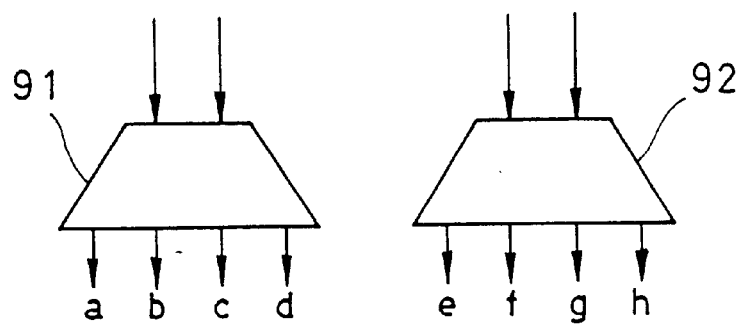
FIG. 8 is an illustration showing a decoder for controlling a bi-directional switch in FIG. 7.

In this case, decoders 91 shown in FIG. 8 are provided corresponding to the bi-directional switches SW1 to SW4. Then, with the decoder outputs a, b, c, d, corresponding one of the bi-directional switches SW1 to SW4 in FIG. 7 is turned into ON state.

On the other hand, decoders 92 shown in FIG. 8 are provided corresponding to the bi-directional switches SW5 to SW8. With the decoder output e, f, g, h, corresponding one of the bi-directional switches SW5 to SW8 is turned into ON state.

Figure 9:
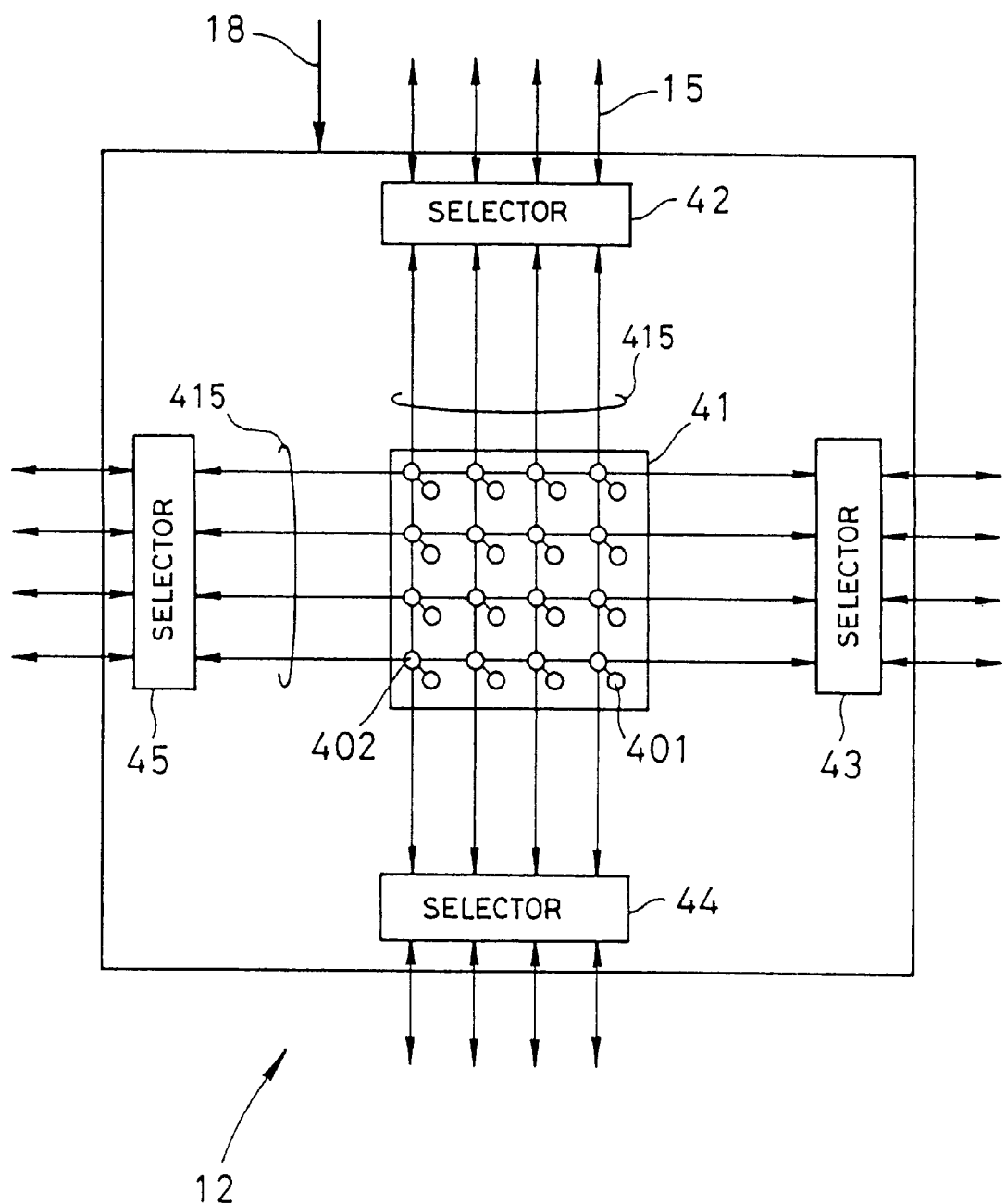
FIG. 9 is an illustration showing a constructional portion which becomes effective in functioning as a programmable wiring circuit in the combined programmable logic/wiring portion in FIG. 3.

FIG. 9 shows components of the combined programmable logic/wiring portion 12, which becomes effective as serving as the programmable wiring circuit by designation of the mode information via the mode designation line. In FIG. 9, the combined programmable logic/wiring portion 12 is constructed with a memory portion 41 and selectors 42 to 45.

The memory portion 41 is constructed by pairing a storage element 401 and a switch element 402 and arranging the pairs into two-dimensional array fashion. The storage element 401 stores one bit information and determines whether the internal bi-directional wiring 415 in vertical and lateral directions are to be connected or not depending upon the one bit storage information. Namely, the memory portion 41 stores a bit map information designating interconnection between the internal bi-directional wiring 415.

For example, respective four internal bi-directional wirings 415 are extending in vertical and lateral directions, bit map information of sixteen bits becomes necessary for establishing connection with arbitrary combination. Therefore, in this case, a construction, in which sixteen storage elements 401 and switch elements 402 are arranged, becomes necessary. It becomes possible to provide restriction for combination of the vertical and lateral internal bi-directional wiring 415 which can be connected, in order to reduce hardware amount or bit map information amount.

In FIG. 9, the selectors 42 to 45 determine whether the bi-directional connection lines 15 connected to the base cell 1 are to be connected to respectively corresponding internal bi-directional wiring lines 415. The control signal of the selectors 42 to 45 determining which bi-directional connection lines 15 are to be connected to the corresponding internal bi-directional wiring lines 415, is applied from the mode detection line 18 as a pair of the mode information.

The construction of the selectors 42 to 45 can be constructed to permit individual designation of connection between the internal bi-directional wiring lines 415 corresponding to the arbitrary bi-directional connection lines 15. However, it is possible to take a construction to permit designation only by a group, with establishing groups constituted with a plurality of bi-directional connection lines 15.

Figure 10:
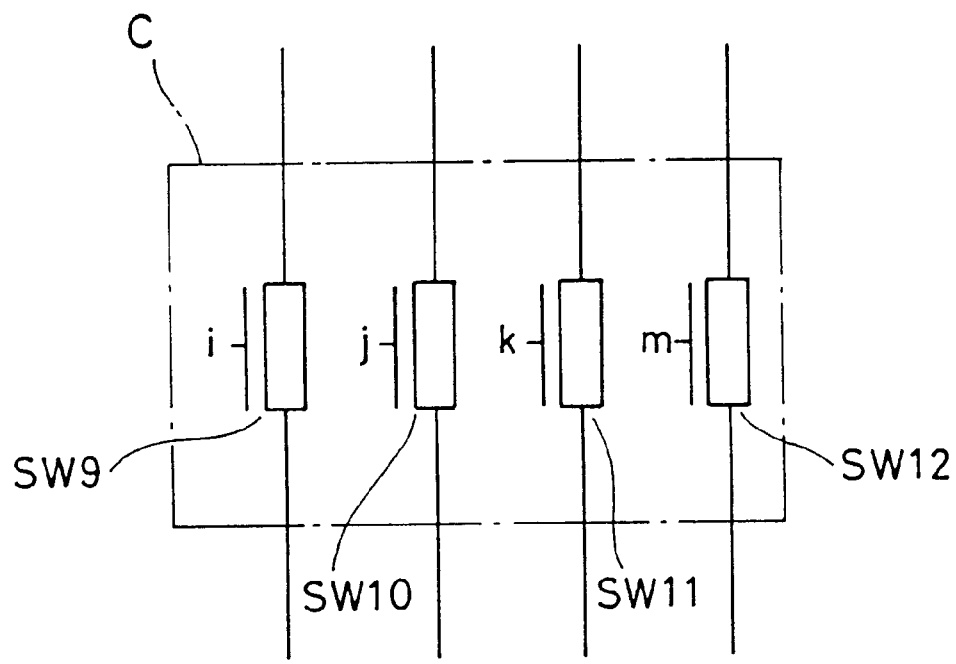
FIG. 10 is an illustration showing an example of an internal construction of each selector in FIG. 9.
Figure 11:
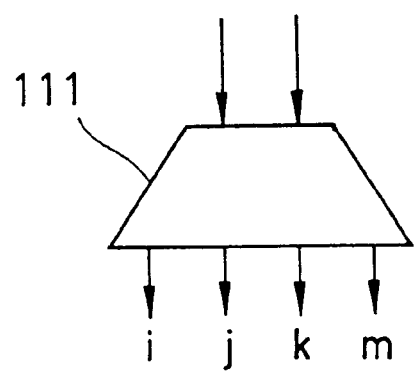
FIG. 11 is an illustration showing a decoder for controlling the bi-directional switch in FIG. 10.

Each selector in FIG. 9 may be constructed as illustrated in FIG. 10, for example. Namely, bi-directional switches SW9 to SW12 constituted of transfer gates are provided corresponding to each of the bi-directional connection lines 15. Then, the bi-directional switches SW9 to SW12 are selectively turned ON. In this case, decoders 111 shown in FIG. 11 are provided corresponding to the bi-directional switches SW9 to SW12. Then, with decoder outputs I, j, k, m, corresponding one of the bi-directional switches SW9 to SW12 in FIG. 10 may be turned into ON state.

Figure 12:
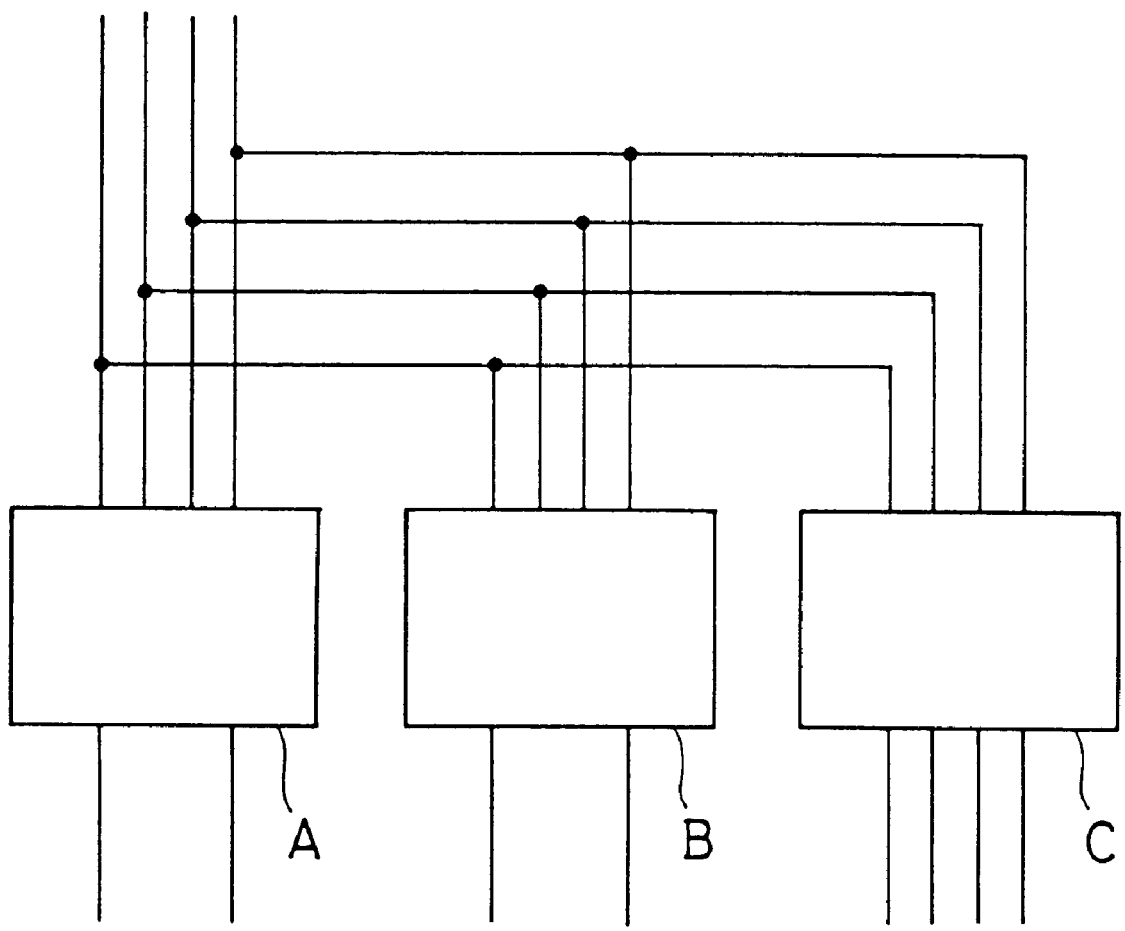
FIG. 12 is an illustration showing an example of internal construction of each selector in FIG. 3.

It should be appreciated that the selectors 52 to 55 in FIG. 3 is formed by connecting the selectors A and B in FIG. 7, the selector C in FIG. 10 in parallel to the bi-directional connection lines 15 as shown in FIG. 12. When the combined programmable logic/wiring portion serves as the programmable logic circuit, the selectors A and B becomes effective. On the other hand, the combined programmable logic/wiring portion serves as the programmable wiring circuit, the selector C becomes effective.

Figure 13:
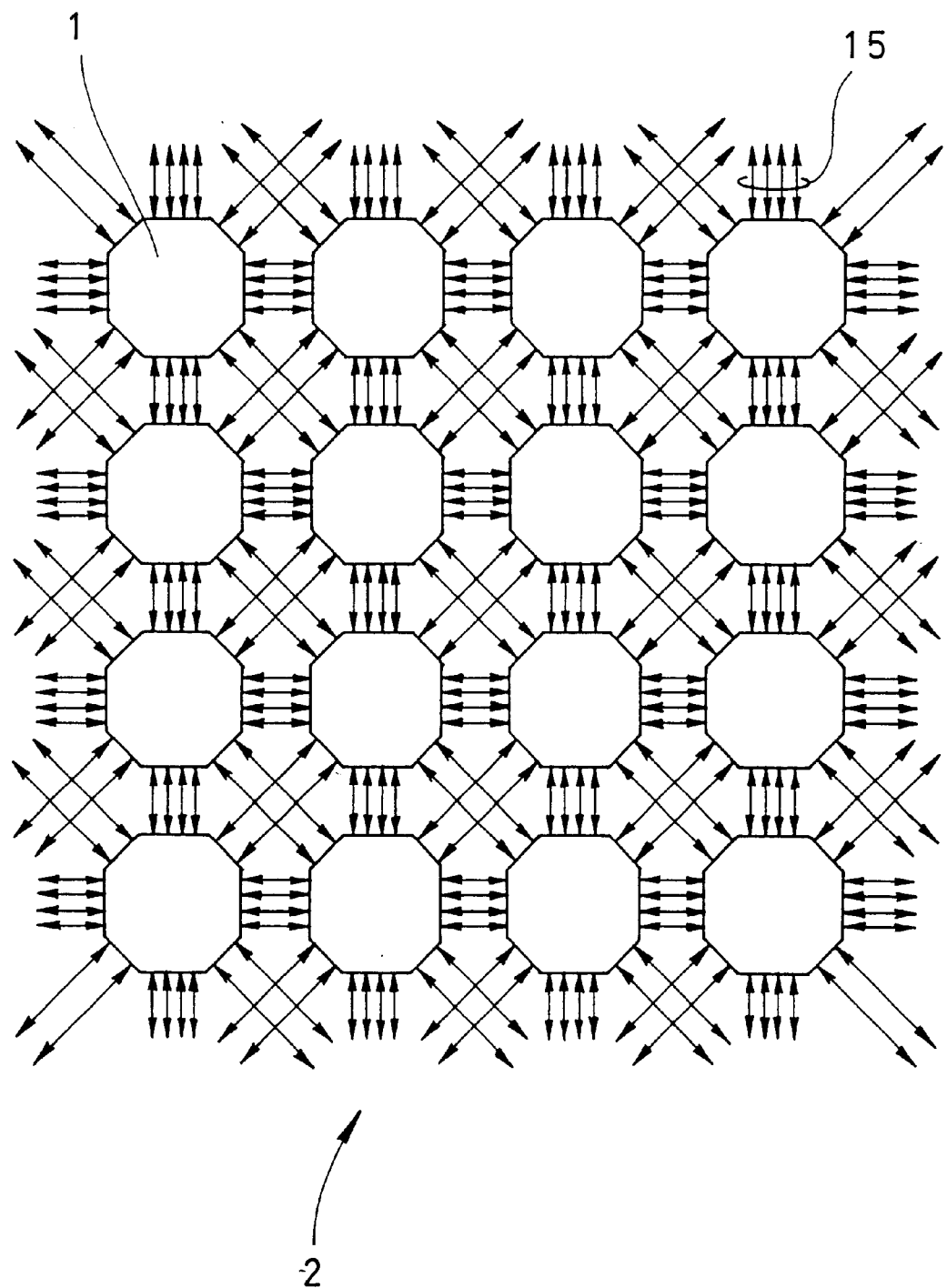
FIG. 13 is a block diagram showing another embodiment of the two-dimensional array of the base cell in another embodiment of the programmable logic LSI according to the present invention.

FIG. 13 is a block diagram showing another embodiment of the two-dimensional array of the base cells in the programmable logic LSI in accordance with the present invention. The two-dimensional array of the base cell in FIG. 2 is formulated by arranging the rectangular base cells 1 in two-dimensional array fashion, whereas the two-dimensional array of the base cell in FIG. 13 is formed by arranging octagonal shaped base cells 1 in two-dimensional array fashion. In FIG. 13, the base cell is directly connected with eight adjacent base cells, i.e. those located, upper and lower sides, left and right sides, obliquely left-upper side, obliquely right-upper side, obliquely left-lower side and obliquely right-lower side, with respective bi-directional connection lines 15. By directly connecting the base cell with obliquely adjacent base cells, delay period can be made smaller upon serving as the programmable wiring circuit. It should be noted that, in order to realize the programmable logic LSI, the input and output cells have to be arranged around the two-dimensional array 2 of the base cells, and the input and output cells have to be connected to the two-dimensional array 2 of the base cells.

Figure 14:
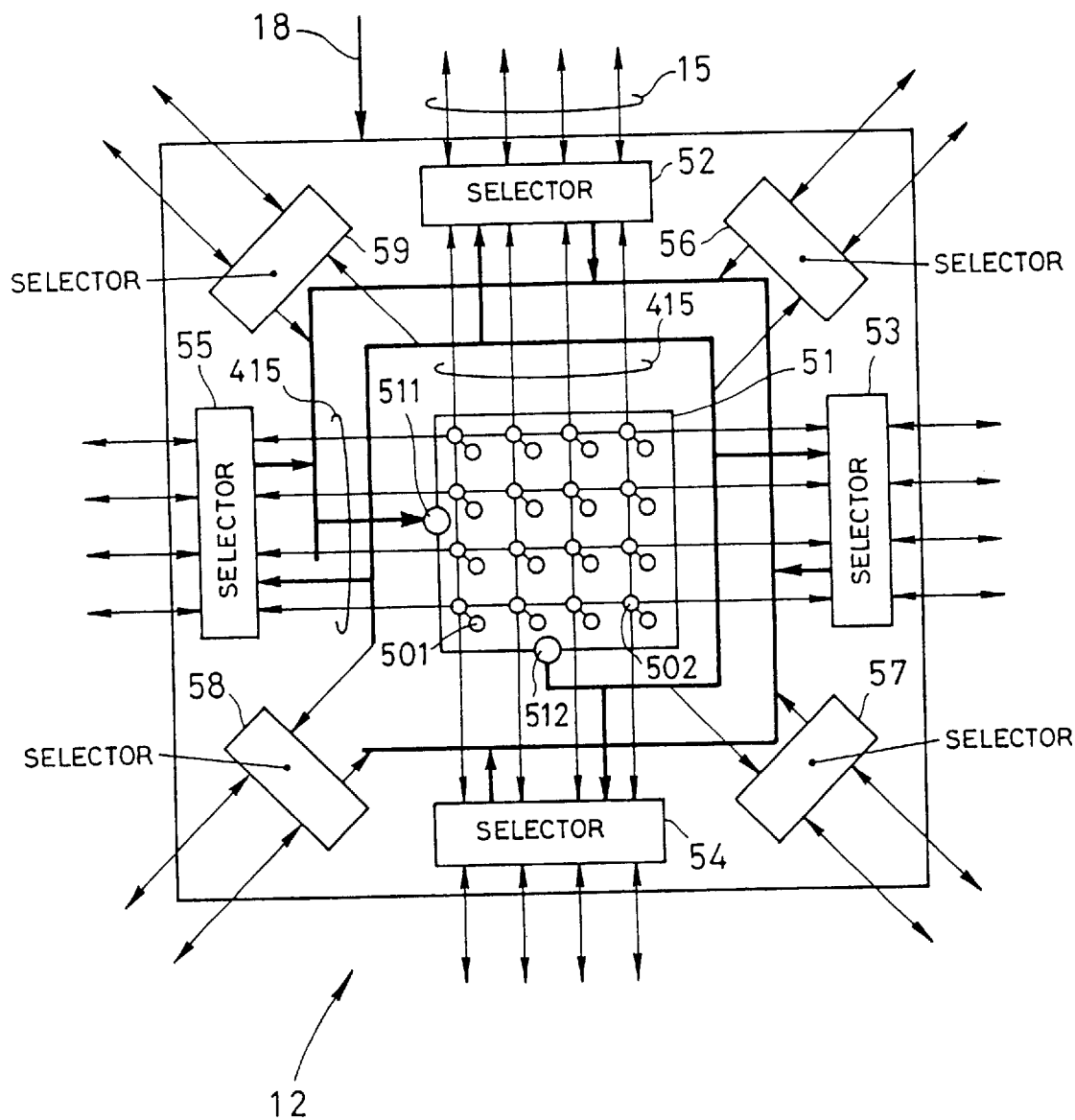
FIG. 14 is an illustration showing an example of internal construction of the combined programmable logic/wiring portion in the base cell in FIG. 13.

In the octagonal base cell in FIG. 13, the combined programmable logic/wiring portion 12 therewithin may have a construction as shown in FIG. 14. Namely, four selectors 56 to 59 are added to the construction of FIG. 3, and these selectors are constructed to be mutually connected with other selectors 52 to 55.

As set forth above, according to the present invention, with the base cell and the two-dimensional array of the base cell, the ratio of the wiring resource and the logical resource can be varied freely depending upon construction of the circuit to be realized, and in conjunction therewith, the programmable logic LSI can be constructed to permit flexible connection between the bi-directional wiring.

The base cell of the programmable logic LSDI according to the present invention can designate to function as the programmable logic circuit or to function as the programmable wiring circuit by the mode information. Accordingly, depending upon the circuit to be realized on the two-dimensional array of the base cell, greater proportion of base cells may serve as programmable wiring circuit when greater amount of wiring resource is required, and greater proportion of base cells may serve as programmable logic circuit when greater amount of logical resource is required.

In the foregoing second prior art, connection between wiring is virtually realized by varying outputting direction from the inputting direction or outputting one input to a plurality of directions without performing logical operation within the logic cell using the function of the logic cell. Because of such method, what can be realized by the logic cell of the second prior art is connection between single direction wiring and connection between the bi-directional wiring cannot be realized.

In contrast to this, as set forth above, the present invention does not take the way "not to perform logical operation" as in the second prior art" but takes novel base cell structure, in which "cross-bus switch structure between the vertical and lateral bi-directional wiring is controlled utilizing the memory for the look-up table of the logic cell". Accordingly, by using the base cell in the wiring mode, flexible wiring structure between the bi-directional wiring can be realized.

Figure 15A:
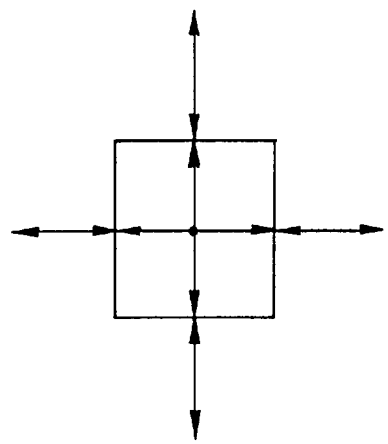
FIG. 15A is an illustration showing a wiring between bi-directional wiring which is enabled by the base cell according to the present invention.
Figure 15B:
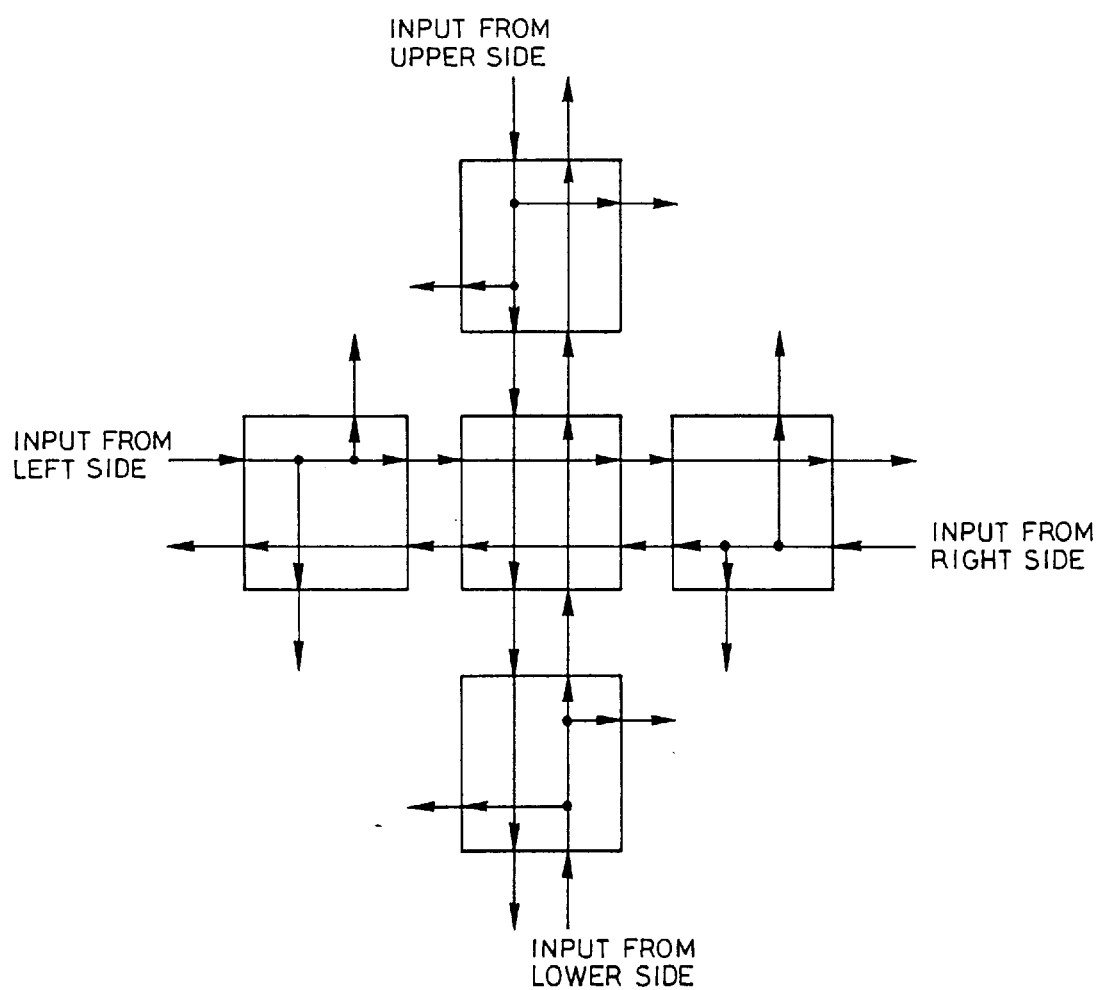
FIG. 15B is an illustration showing a wiring between the bi-directional wiring which can be realized by the conventional base cell.

Flexible wiring between the bi-directional wiring which has been enabled by the present invention, can realize connection between wiring with smaller number of base cells. Therefore, the given circuit can be realized with smaller two-dimensional array of the base cells. For example, as shown in FIG. 15A (vertical and lateral wiring are illustrated as single wiring of the purpose of illustration), the switch between the vertical and lateral bi-directional wiring can be realized with single base cell by using the base cell of the present invention. On the other hand, when the similar function is realized with the conventional base cell (cell having one set of single direction wiring pair), at least five base cells become necessary, as shown in FIG. 15B. Namely, in FIG. 15B, the signal input from upper side, lower side, left side or right side is distributed to in obliquely right-upper direction, obliquely left-upper, obliquely right-lower or obliquely left-lower directions, respectively.

While FIGS. 15A and 15B show the simplest construction, difference of area efficiency between the present invention and the second prior art will be more remarkable. As set forth above, flexible wiring between the bi-directional wiring according to the present invention can be realized by smaller area.

It should be appreciated that, because of the problem set forth above, the second prior art frequently attempt to realize flexible wiring structure as much as possible by providing vertical and lateral bi-directional wiring independently of the base cell, in the vicinity of the base cell, in practice. Such method incorporates the fixed wiring region in the first prior art in the second prior art and thus inherently holds the drawback encountered in the first prior art.

Figure 16:
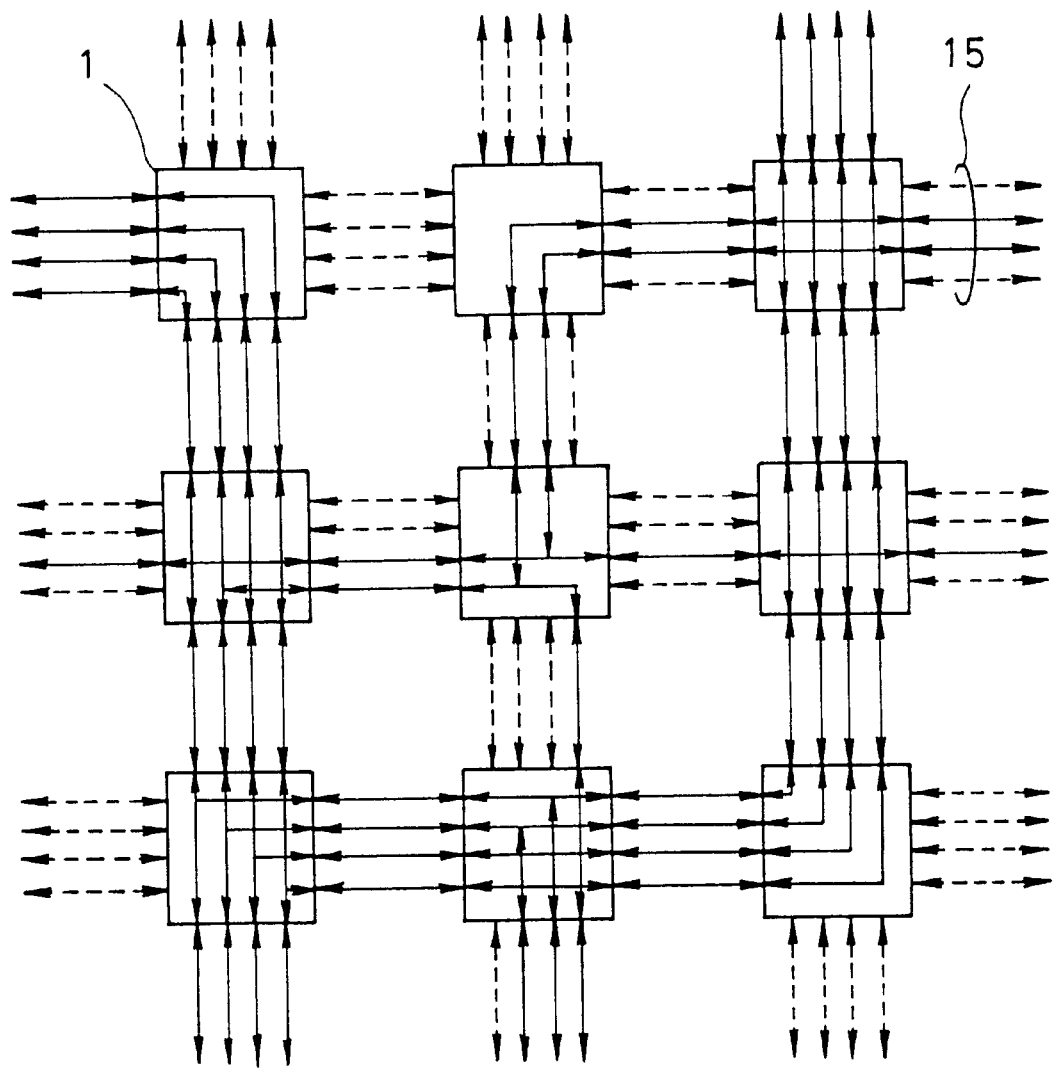
FIG. 16 is an illustration showing an example of construction of a connection network of flexible bi-directional wiring using a part of the two-dimensional array according to the present invention.

FIG. 16 is an illustration showing an example of construction of a connection network of flexible wiring established using a part of the two-dimensional array 2 of the base cell according to the present invention. In FIG. 16, among the bi-directional connection lines 15, those not actually used as wiring are shown by arrow in broken line. In the second prior art constructing the programmable logic LSI using the single base cell, such connection network cannot be formed using such bi-directional wiring. In contrast to this, in accordance with the present invention, the connection network can be established using such bi-directional wiring.

As set forth above, the combined programmable circuit realizing the programmable logic circuit function and the programmable wiring circuit function are provided and the logic circuit function and the wiring circuit function are selectively made effective depending upon the mode information to resolve drawback encountered by fixed ratio of the wiring resource and the logical resource as the drawback in the programmable logic LSI, and to make variation of the ratio of the wiring resource and the logical resource freely depending upon the construction of the circuit to be realized. On the other hand, it becomes possible to efficiently realize circuit having various characteristics with enabling flexible connection between the bi-directional wiring.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A base cell array for a programmable logic LSI which is formed by connecting a plurality of said base cells, each of said base cells comprising:

a combined programmable circuit realizing a programmable logic circuit function and a programmable wiring circuit function; and a mode setting circuit for selectively making said combined programmable circuit realize one of said programmable logic circuit function and said programmable wiring circuit function according to a mode information;

each said base cell becoming a logic resource when said mode setting circuit makes said combined programmable circuit realize said programmable logic circuit function and each said base cell becoming a wiring resource when said mode setting circuit makes said combined programmable circuit realize said programmable wiring circuit function, thereby allowing a ratio of wiring resources to logical resources to vary in said base cell array.

2. A base cell array as set forth in claim 1, wherein said mode setting circuit has a mode information memory storing said mode information, and one of said programmable logic circuit function and said programmable wiring circuit function is selectively made effective according to said mode information stored in said mode information memory.

3. A base cell array as set forth in claim 1, wherein each of a plurality of said base cells connected for forming said programmable logic LSI is connected to an adjacent other base cell with a plurality of bi-directional connection lines.

4. A two-dimensional array of base cells formed by arranging a plurality of base cells defined in claim 1, in two-dimensional array and connecting respectively adjacent base cells with a plurality of bi-directional connection lines.

5. A two-dimensional array of base cells as set forth in claim 1, wherein each of said base cells in said two-dimensional array is connected with four base cells adjacent in upward, downward, leftward and rightward direction.

6. A two-dimensional array of base cells as set forth in claim 4, wherein each of said base cells in said two-dimensional array is connected with adjacent eight base cells arranged therearound.

7. A base cell array for a programmable logic LSI which is formed by connecting a plurality of said base cells, each of said base cells comprising:

a combined programmable circuit realizing a programmable logic circuit function and a programmable wiring circuit function; and a mode setting circuit for selectively making one of said programmable logic circuit function and said programmable wiring circuit function according to a mode information, wherein each of a plurality of said base cells connected for forming said programmable logic LSI is connected to adjacent other base cell with a plurality of bi-directional connection lines, and wherein said combined programmable circuit includes a storage element group outputting data corresponding to input data and a switch group provided corresponding to each storage element of said storage element group, when said programmable wiring circuit function is effective, one of said plurality of bi-directional connection lines is electrically connected with other bi-directional connection line by ON/OFF controlling each switch element of corresponding switch element group depending upon each storage data of said storage element group.

8. A base cell array as set forth in claim 7, wherein said storage data of each storage element of said storage element group is externally input.

9. A base cell array as set forth in claim 7, wherein a bit map information designating interconnection between internal bi-directional wiring is stored in said storage element.

10. A two-dimensional base cell array for a programmable logic LSI which is formed by connecting a plurality of said base cells, each of said base cells comprising:

a combined programmable circuit realizing a programmable logic circuit function and a programmable wiring circuit function; and a mode setting circuit for selectively making one of said programmable logic circuit function and said programmable wiring circuit function according to a mode information wherein all of a mode information memory storing said mode information within each of said base cells in said two-dimensional array are serial connected in daisy chain, and said mode information is externally input in sequential order.

11. A base cell array as set forth in claim 10, wherein said mode setting circuit has said mode information memory, and one of said programmable logic circuit function and said programmable wiring circuit function is selectively made effective according to said mode information stored in said mode information memory, and wherein each of said plurality of said base cells connected for forming said programmable logic LSI is connected to an adjacent other base cell with a plurality of bi-directional connection lines.

12. A base cell array for a programmable logic LSI which is formed by connecting a plurality of said base cells, each of said base cells comprising:

a combined programmable circuit realizing a programmable logic circuit function and a programmable wiring circuit function; and a mode setting circuit for selectively making one of said programmable logic circuit unction and said programmable wiring circuit function according to a mode information, wherein each of a plurality of said base cells connected for forming said programmable logic LSI is connected to adjacent other base cell with a plurality of bi-directional connection lines, and wherein said combined programmable circuit includes a storage element group outputting data corresponding to input data and a switch group provided corresponding to each storage element of said storage element group, when said programmable logic circuit function is effective, a storage data of said storage element in said storage element group designated by a signal input from one of said plurality of bi-directional connection line is output to other bi-directional connection line.

13. A base cell array as set forth in claim 12, wherein a look-up table information for realizing predetermined logical operation is stored in said storage element.

* * * * *